(12) United States Patent
Huang (10) Patent No.: US 9,653,628 B2
(45) Date of Patent: May 16, 2017

(54) ABSORBER LAYER FOR PHOTOVOLTAIC DEVICE, AND METHOD OF MAKING THE SAME

(71) Applicant: TSMC Solar Ltd., Taichung (TW)

(72) Inventor: Chien-Yao Huang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/202,049

(22) Filed: Mar. 10, 2014

(65) Prior Publication Data

US 2015/0255648 A1    Sep. 10, 2015

(51) Int. Cl.
*H01L 31/0352* (2006.01)
*H01L 31/0749* (2012.01)
(Continued)

(52) U.S. Cl.
CPC ...... *H01L 31/0352* (2013.01); *H01L 21/0251* (2013.01); *H01L 21/02485* (2013.01); *H01L 21/02568* (2013.01); *H01L 21/02587* (2013.01); *H01L 21/02614* (2013.01); *H01L 21/02631* (2013.01); *H01L 31/0322* (2013.01);
(Continued)

(58) Field of Classification Search
CPC ............ H01L 31/0322; H01L 31/0749; H01L 31/076; H01L 31/18; H01L 31/1864; H01L 31/032; H01L 31/0321; H01L 31/0323; H01L 31/0324; H01L 31/0325; H01L 31/0326; H01L 31/0327; H01L 31/0328; H01L 31/0352; H01L 31/0384; H01L 31/072; H01L 31/03529; H01L 31/075; H01L 51/0037; H01L 51/426; H01L 31/04; H01L 31/0392; H01L 31/03928; H01L 31/1836; H01L 31/1876; H01L 31/0463; H01L 31/046; H01L 31/03925; H01L 31/0465; H01L 31/036; H01L 31/035272; H01L 31/065; H01L 21/02587; H01L 21/02485; H01L 21/0251; H01L 21/02568; H01L 21/02631; H01L 21/02614; Y02E 10/541; Y02E 10/548; Y02E 10/50; B82Y 30/00; B82Y 20/00; C23C 14/35; Y02P 70/521
See application file for complete search history.

(56) References Cited

U.S. PATENT DOCUMENTS 6,310,281 B1 * 10/2001 Wendt ................ H01L 31/0392
136/244
7,235,736 B1 * 6/2007 Buller ............... H01L 31/03528
136/246
(Continued)

OTHER PUBLICATIONS

Official Action issued Jun. 3, 2016 in counterpart Chinese patent application No. 2016053102014160.

*Primary Examiner* — Jeffrey T Barton
*Assistant Examiner* — Michael Y Sun
(74) *Attorney, Agent, or Firm* — Duane Morris LLP (57) ABSTRACT

A photovoltaic device includes a substrate, a back contact layer disposed above the substrate, and an absorber layer disposed above the back contact layer. The absorber layer includes at least two regions at respectively different horizontally locations. Each respective region has a respectively different concentration profile of an ingredient at a respective depth of the absorber layer.

20 Claims, 10 Drawing Sheets

(51) Int. Cl.
*H01L 31/065* (2012.01)
*H01L 31/032* (2006.01)
*H01L 21/02* (2006.01)

(52) U.S. Cl.
CPC ........ *H01L 31/065* (2013.01); *H01L 31/0749* (2013.01); *Y02E 10/50* (2013.01); *Y02E 10/541* (2013.01)

(56) References Cited

U.S. PATENT DOCUMENTS

| | | | | |
|---|---|---|---|---|
| 2008/0092945 | A1* | 4/2008 | Munteanu | B82Y 30/00 136/252 |
| 2009/0014055 | A1* | 1/2009 | Beck et al. | 136/246 |
| 2011/0308616 | A1* | 12/2011 | Kamada | H01L 31/0322 136/262 |
| 2014/0042580 | A1* | 2/2014 | Oomae | H01L 31/0322 257/436 |
| 2015/0207010 | A1* | 7/2015 | Huang | H01L 31/065 136/255 |

* cited by examiner

ABSORBER LAYER FOR PHOTOVOLTAIC DEVICE, AND METHOD OF MAKING THE SAME

PRIORITY CLAIM AND CROSS-REFERENCE

None.

BACKGROUND

The disclosure relates to photovoltaic devices generally, and more particularly relates to a photovoltaic device, and the method of making the photovoltaic device.

Photovoltaic devices (also referred to as solar cells) absorb sun light and convert light energy into electricity. Photovoltaic devices and manufacturing methods therefore are continually evolving to provide higher conversion efficiency with thinner designs.

Thin film solar cells are based on one or more layers of thin films of photovoltaic materials deposited on a substrate. The film thickness of the photovoltaic materials ranges from several nanometers to tens of micrometers. Examples of such photovoltaic materials include cadmium telluride (CdTe), copper indium gallium selenide (CIGS) and amorphous silicon ($\alpha$-Si). These materials function as light absorbers. A photovoltaic device can further comprise other thin films such as a buffer layer, a back contact layer, and a front contact layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a thin-film photovoltaic device, a back contact layer is deposited over a substrate. An absorber layer is deposited over the back contact layer. A buffer layer comprising a suitable buffer material is disposed above an absorber layer. The buffer layer and the absorber layer, which both comprise a semiconductor material, provide a p-n or n-p junction. When the absorber layer absorbs sun light, electric current can be generated at the p-n or n-p junction.

A "I-III-VI$_2$" compound such as copper indium gallium selenide and/or sulfide (CIGS) can be used as an absorber layer in thin film solar cells. CIGS thin film solar cells have achieved excellent conversion efficiency.

Unless expressly indicated otherwise, references to a "front side" of a substrate made in this disclosure will encompass the side above which an absorber layer will be deposited. References to a "back side" of the substrate made below will encompass the other side of the substrate opposite the absorber layer. References to a "substrate" will encompass a substrate alone or a substrate having a back contact layer thereon, for example, a metal coated glass substrate. When the substrate is a metal coated glass, the "back side" is the glass layer while the "front side" is the metal layer deposited over the glass layer as the back contact layer.

Unless expressly indicated otherwise, references to a "I-III-VI$_2$ compound" made in this disclosure will encompass a material selected from a Group I element, a Group III element, an alloy or any combination thereof. The Group I element can be Cu or Ag. The Group III element can be selected from Al, Ga, In or Tl. The Group VI element can be sulfur or selenium (Se). In this disclosure, Group I, Group III, and Group VI refer to Group IB, Group IIIA and Group VIA, respectively, in the "traditional" periodic table. Based on the modern numbering system recommended by the International Union of Pure and Applied Chemistry (IUPAC), Group I, Group III, and Group VI refer to Group 11, Group 13 and Group 16, respectively.

Unless expressly indicated otherwise, references to "CIS" made in this disclosure will encompass a material comprising copper as a Group I element, and a Group III element, and a Group VI element. The Group III element can be selected from Al, Ga, In or Tl. The Group VI element can be sulfur or selenium (Se). The "CIS-based" absorber layer is an absorber comprising an CIS material. Examples of CIS include but are not limited to $CuInSe_2$, $Cu(InGa)Se_2$, $CuInS_2$, $Cu(InGa)S_2$, $Cu(InGa)(Se, S)_2$ and any combination thereof.

Unless expressly indicated otherwise, references to "CIGS" made in this disclosure will encompass a material comprising copper indium gallium sulfide and/or selenide, for example, copper indium gallium selenide, copper indium gallium sulfide, and copper indium gallium sulfide/selenide. A selenide material may comprise sulfide or selenide can be completely replaced with sulfide.

Unless expressly indicated otherwise, references to "GGI ratio" made in this disclosure will encompass an atomic or molar ratio of Ga to the total amount of Ga and In (i.e., Ga/(Ga+In)) in an absorber layer. An increased GGI ratio results in an increase on band gap and conduction band minimum (Ec) of the "CIS-based" absorber.

In some embodiments, an absorber layer comprises a "I-III-$VI_2$ compound" such as a "CIS-based" compound. Such an absorber layer comprises a uniform distribution or one dimensional distribution of ingredients (e.g., GGI ratio) across the absorber layer. However, the resulting absorber layer and subsequently formed buffer layer may form a hetero junction having defects in the interface. The charge recombination due to the defects causes a drop in the quantum efficiency.

The present disclosure provides a method for fabricating a photovoltaic device, and a resulting photovoltaic device comprising an absorber layer having three-dimensional ingredient distribution (3D) (e.g., a 3D distribution of different GGI ratios) therein. The 3D ingredient distribution results in a reduction of recombination loss in the depletion region and an improvement of recombination current (J0). Such a 3D ingredient distribution also provides three dimensional transportation paths for minority carriers, and increases minority carrier collection. These improvements result in improved performance of resulting photovoltaic device such as increased open-circuit voltage (Voc) and fill factor (FF).

Figure 1A:
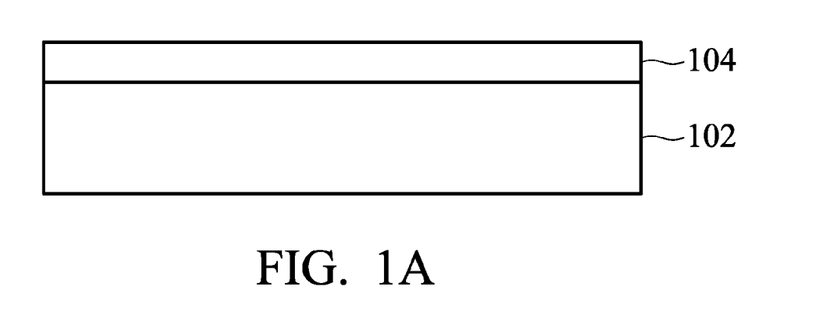
FIGS. 1A-1B are cross-sectional views of a portion of an exemplary photovoltaic device during fabrication, in accordance with some embodiments.
Figure 1B:
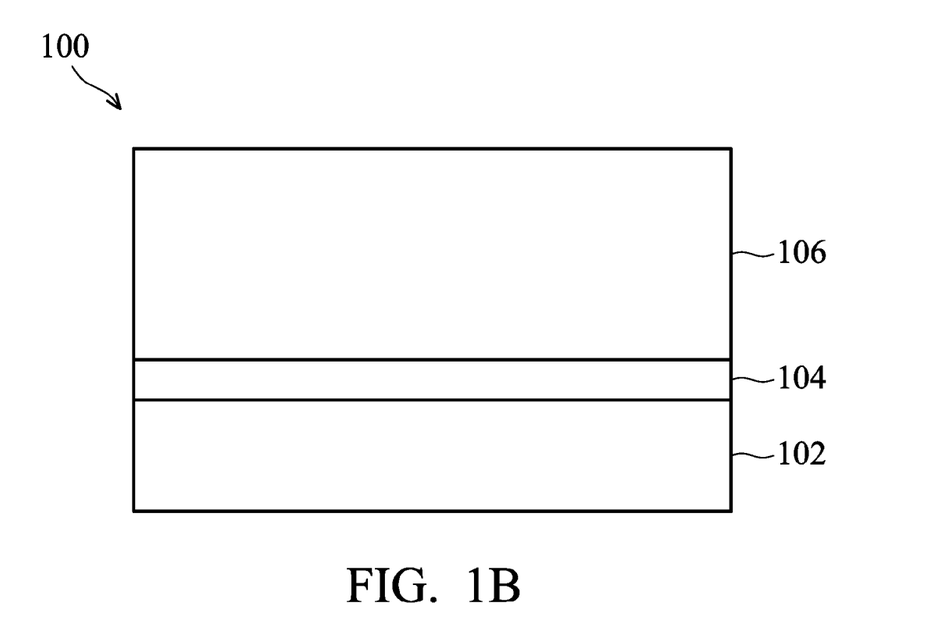

In FIGS. 1A-1B and 4A-4E, like items are indicated by like reference numerals, and for brevity, descriptions of the structure, provided above with reference to the previous figure, are not repeated. The methods are described in FIGS. 2A-2B and 3 with reference to the exemplary structure described in FIGS. 1A-1B. FIGS. 1A-1B show a solar cell at two different stages in the fabrication process. As shown in FIG. 1A, a back contact layer 104 is formed over a substrate 102. As shown in FIG. 1B, an absorber layer 106 is formed above back contact layer 104.

Figure 2A:
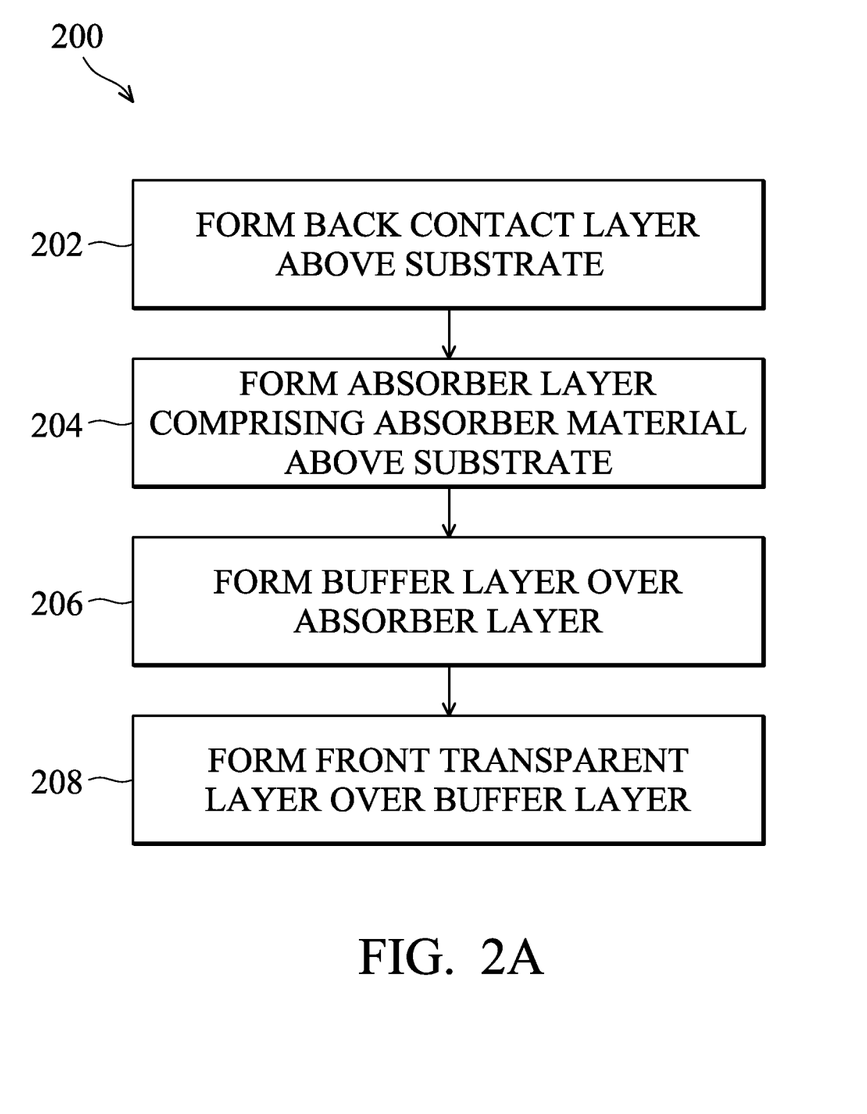
FIG. 2A is a flow chart diagram illustrating a method of fabricating an exemplary photovoltaic device in accordance with some embodiments.
Figure 2B:
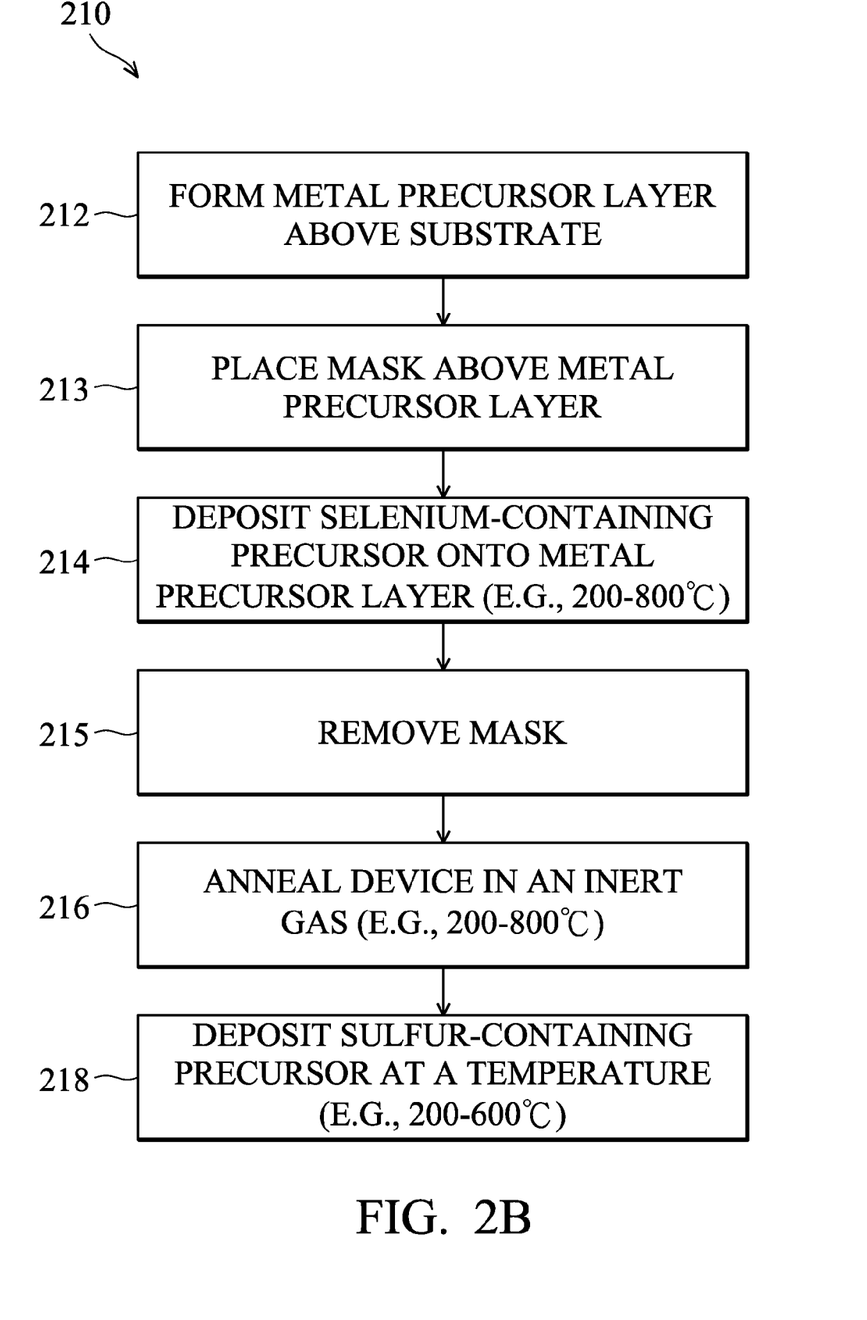
FIG. 2B is a flow chart diagram illustrating a method of forming an absorber layer in accordance with some embodiments.
Figure 3:
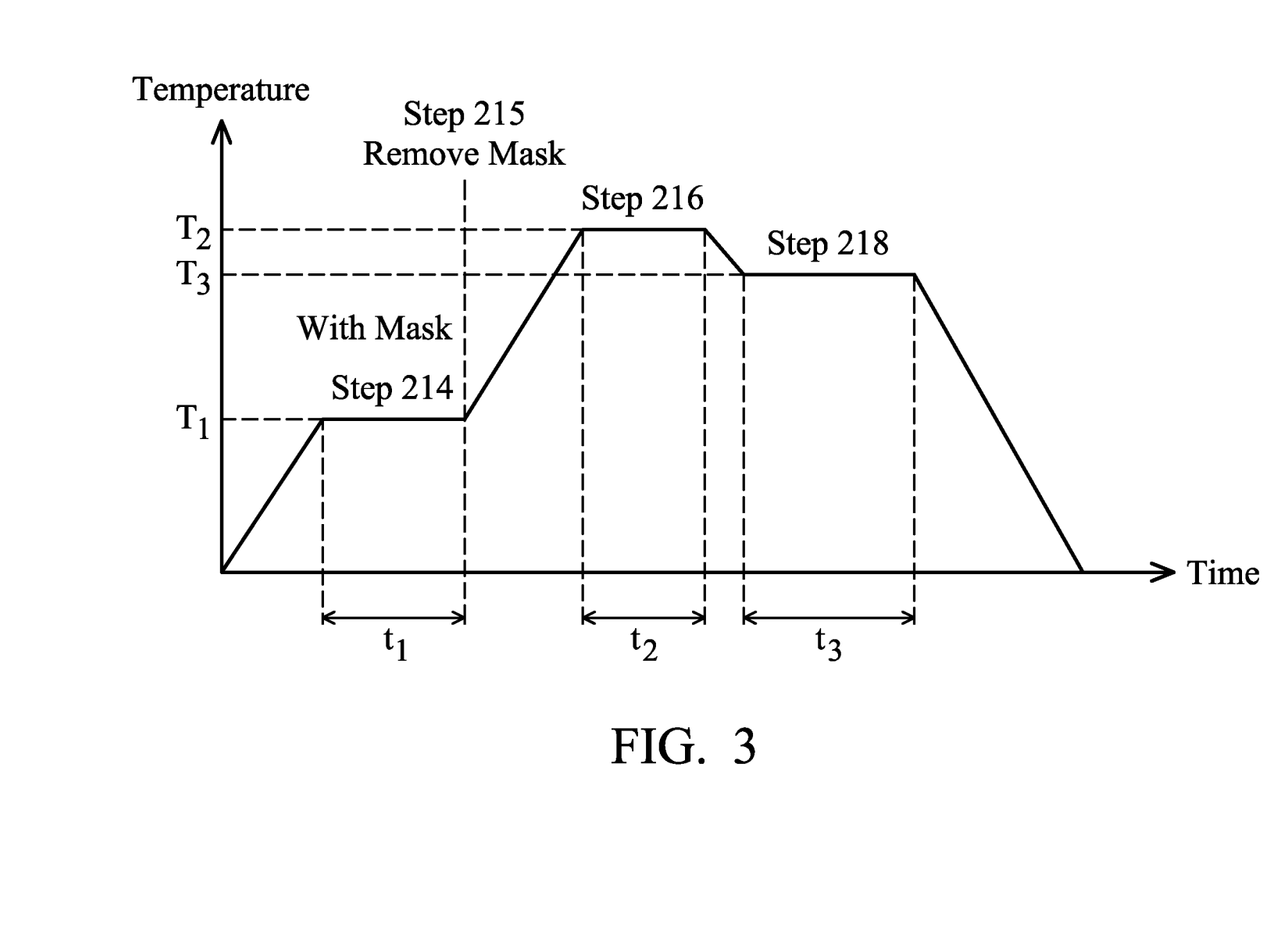
FIG. 3 illustrates an exemplary process for forming an absorber layer comprising a step of masking a metal precursor layer before a step of selenization followed by a step of annealing and a step of sulfuration in accordance with some embodiments.
Figure 5A:
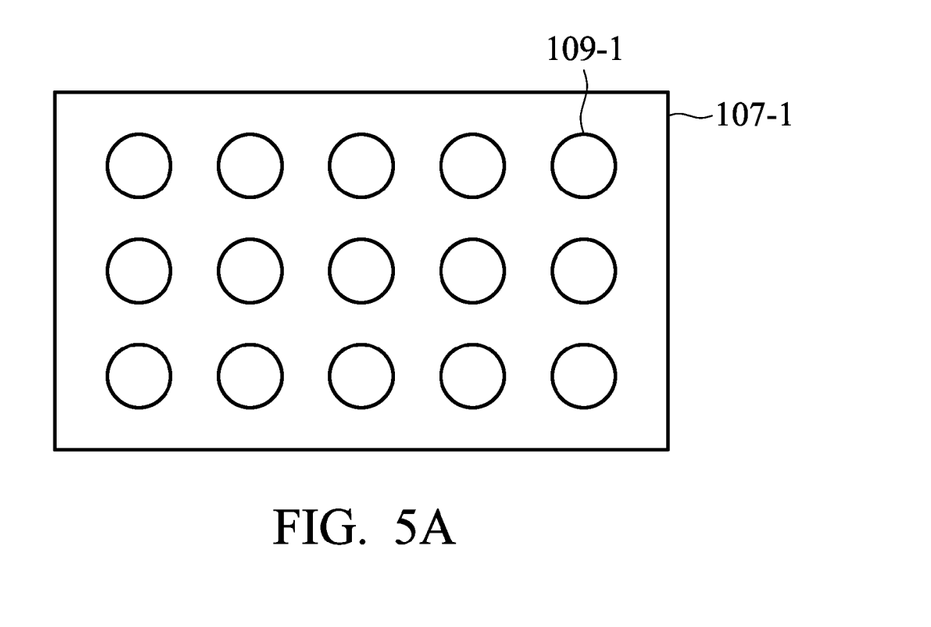
FIGS. 5A-5C are plan views of exemplary masks to be placed above a metal precursor layer during a process of forming an absorber layer in accordance with some embodiments.
Figure 5B:
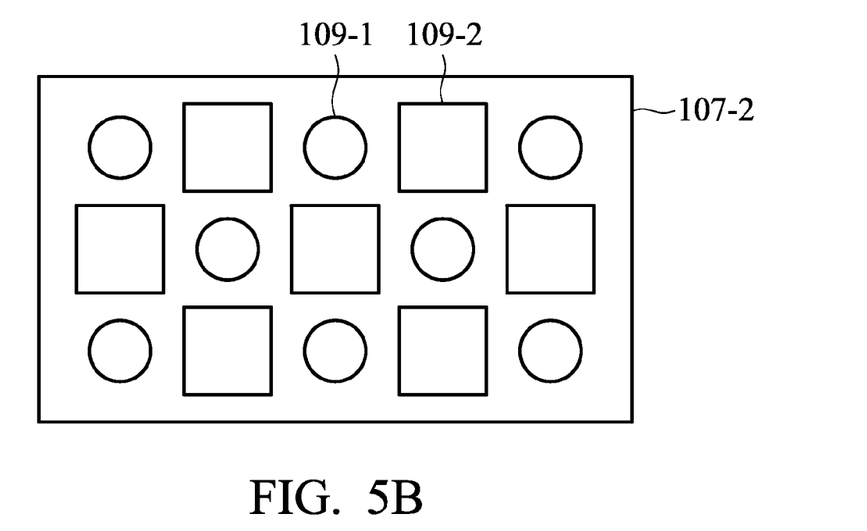
Figure 5C:
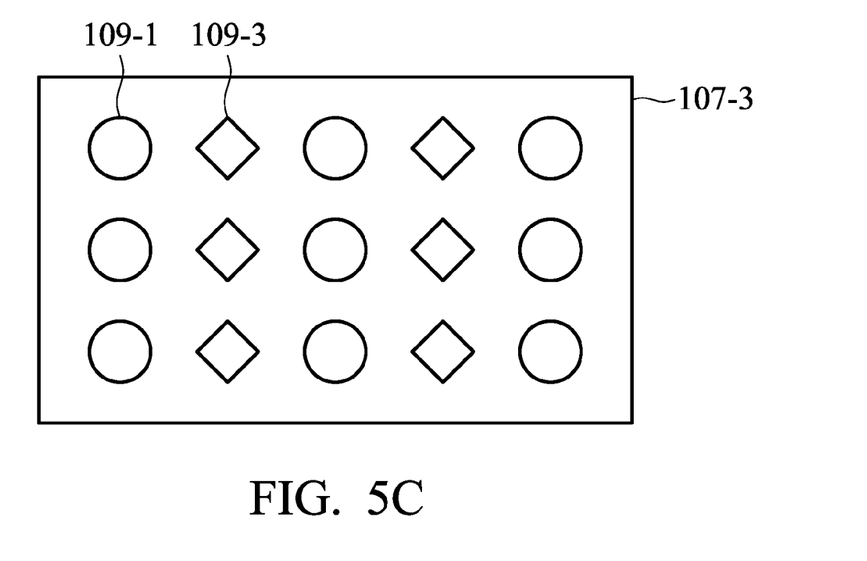
Figure 6A:
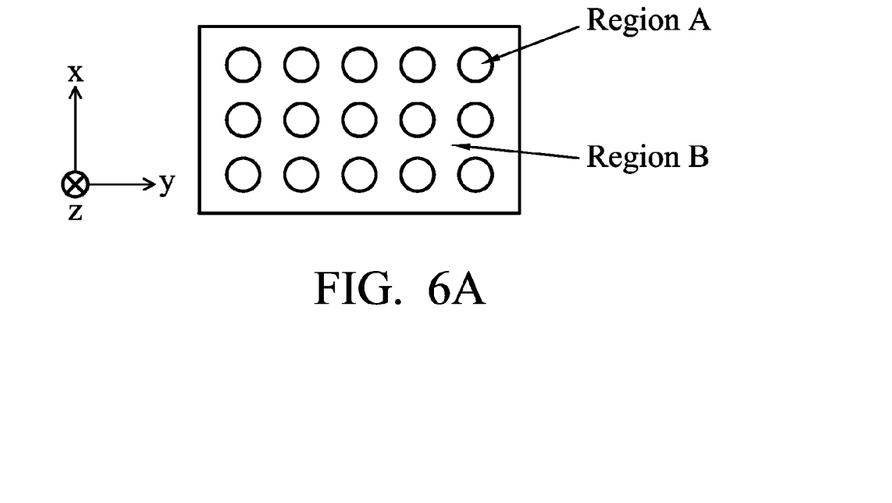
FIG. 6A is a plan view of an exemplary absorber layer having two regions (region A and region B) in accordance with some embodiments.
Figure 6B:
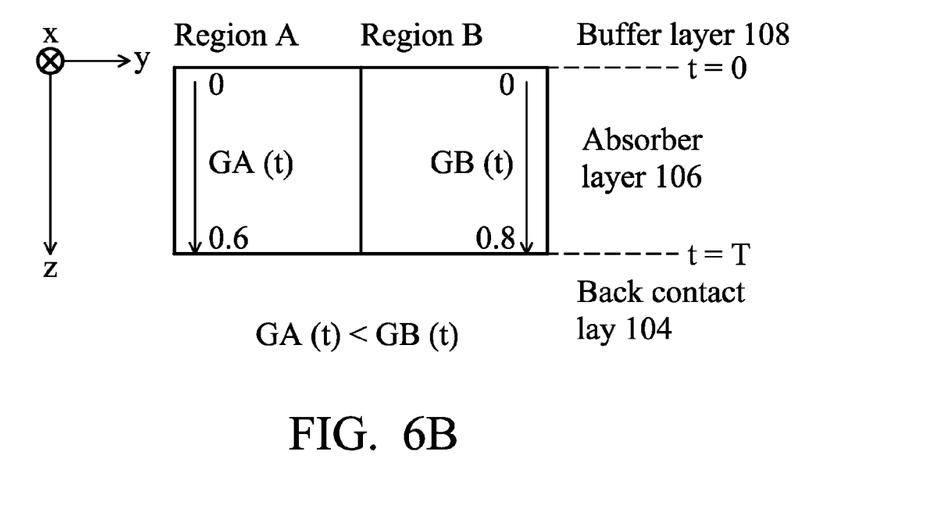
FIG. 6B is a cross-sectional view of the regions (region A and area B) in the exemplary absorber of FIG. 6A.

FIG. 2A illustrates an exemplary method 200 of fabricating an exemplary photovoltaic device 100 in accordance with some embodiments. FIG. 2B and FIG. 3 illustrate an exemplary method 210 of forming an absorber layer 106 comprising using a mask in some embodiments. The resulting absorber layer 106 has a 3D ingredient distribution (e.g., a GGI ratio). Method 210 is described in FIGS. 2B and 3 with reference to the exemplary structure described in FIGS. 4A-4E. The exemplary masks used are described in FIGS. 5A-5C. FIGS. 6A-6B illustrate a resulting structure of absorber layer 106 in accordance with some embodiments.

At step 202 of FIG. 2A, a back contact layer 104 is formed above a substrate 102. The resulting structure of a portion of a photovoltaic device 100 is illustrated in FIG. 1A.

Substrate 102 and back contact layer 104 are made of any material suitable for such layers in thin film photovoltaic devices. Examples of materials suitable for use in substrate 102 include but are not limited to glass (such as soda lime glass), polymer (e.g., polyimide) film and metal foils (such as stainless steel). The film thickness of substrate 102 is in any suitable range, for example, in the range of 0.1 mm to 5 mm in some embodiments.

In some embodiments, substrate 102 can comprise two or more layers. For example, substrate 102 can include a first layer 101 (not shown) comprising glass, and a second layer 103 (not shown) disposed over the first layer and comprising silicon dioxide, which can be used to block possible diffusion of sodium in glass. In some embodiments, layer 101 comprises soda lime glass or other glass, which can tolerate a process at a temperature higher than 600° C. In some embodiments, layer 103 comprises silicon oxide having a formula $SiO_x$, where x ranges from 0.3 to 2.

Examples of suitable materials for back contact layer 104 include, but are not limited to molybdenum (Mo), copper, nickel, or any other metals or conductive material. Back contact layer 104 can be selected based on the type of thin film photovoltaic device. For example, back contact layer 104 is Mo in some embodiments. The thickness of back contact layer 104 is on the order of nanometers or micrometers, for example, in the range from 100 nm to 20 microns. The thickness of back contact layer 104 is in the range of from 200 nm to 10 microns in some embodiments. Back contact layer 104 can be also etched to form a pattern.

At step 204 of FIG. 2A, an absorber layer 106 comprising an absorber material is formed above back contact layer 104 and above substrate 102. The resulting structure of photovoltaic device 100 is as illustrated in FIG. 1B.

Absorber layer 106 can be a p-type or n-type semiconductor material. Examples of materials suitable for absorber layer 106 include but are not limited to copper indium gallium selenide (CIGS), cadmium telluride (CdTe), and amorphous silicon (α-Si). In some embodiments, absorber layer 106 comprises a Group I element (e.g., Cu or Ag). In some embodiments, absorber layer 106 comprises a I-III-$VI_2$ compound such as a CIS-based compound comprising copper such as $CuInSe_2$, $Cu(InGa)Se_2$, $CuInS_2$, $Cu(InGa)S_2$, $Cu(InGa)(Se, S)_2$ and any combination thereof. For example, absorber layer 106 can comprise material of a chalcopyrite family (e.g., CIGS). In some embodiments, absorber layer 106 is a semiconductor comprising copper, indium, gallium and selenium, such as $CuIn_xGa_{(1-x)}Se_2$, where x is in the range of from 0 to 1. Selenium can be also replaced with sulfur. In some embodiments, absorber layer 106 is a p-type semiconductor. Absorber layer 106 has a thickness on the order of nanometers or micrometers, for example, 0.5 microns to 10 microns. In some embodiments, the thickness of absorber layer 106 is in the range of 500 nm to 2 microns.

Absorber layer 106 can be formed according to methods such as sputtering, chemical vapor deposition, printing, electrodeposition or the like. In some embodiments, the selenium is deposited by evaporation physical vapor deposition (PVD).

A variety of different processes can be used to form absorber layer 106 at step 204. For purpose of illustration, one exemplary method 210 is described below.

FIG. 2B and FIG. 3 illustrate an exemplary method 210 of forming an absorber layer 106, comprising placing a mask 113 above a metal precursor layer 105, followed by a step of selenization, a step of annealing and a step of sulfuration in accordance with some embodiments. Method 210 can comprise steps 212, 213, 214, 216 and 218.

Figure 4A:
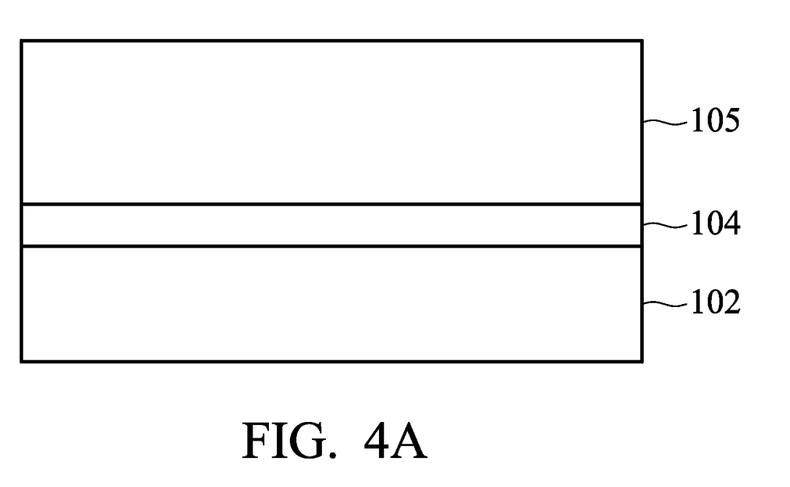
FIGS. 4A-4E are cross-sectional views of a portion of an exemplary photovoltaic device being fabricated through a method of FIG. 2B or FIG. 3 in accordance with some embodiments.

At step 212 of FIG. 2B, as shown in FIG. 4A, a metal precursor layer 105 is formed above substrate 102. Metal precursor layer 105 can comprise at least one material selected from the group consisting of a Group I element such as Cu and Ag. In some embodiments, the Group I element in metal precursor layer 105 comprises Cu only. Metal precursor layer 105 can further comprise a Group III element such as Al, Ga, In and Tl, and any alloy or combination thereof. Metal precursor layer 105 can comprise selenium (Se) in some embodiments.

Metal precursor layer 105 can be formed using any suitable method. For example, metal precursors can be formed by sputtering from at least one sputtering source in a vacuum chamber. Sputtering sources can be, for example, a magnetron, an ion beam source, a RF generator, or any suitable sputtering source configured to deposit a respective ingredient for an absorber layer. Each sputtering source can include at least one sputtering target. A suitable sputtering gas such as argon can be used. Other possible sputtering gases include krypton, xenon, neon, and similarly inert gases.

In some embodiments, more than two sputtering sources can be used to form the metal precursors. For example, a first sputtering source can be used to deposit atoms of a first ingredient (e.g., Cu, or Cu and Ga) for absorber layer. A second sputtering source can be used to deposit atoms of a second ingredient (e.g. In). The ingredients can be co-deposited or deposited at different layers at a predetermined ratio.

At step 212, metal precursor layer 105 can be in one or two layers. For example all the elements including both Group I and Group III elements can be co-deposited together. In some embodiments, two or three layers can be formed. For example, a bottom layer comprising Cu and Ga in any suitable atomic ratio (e.g., Cu/Ga in the range of from 70:30 to 60:40) is first deposited. A second layer comprising Cu and Ga in a different atomic ratio (e.g., Cu/Ga in the range of from 85:15 to 75:25) is then formed. A top layer comprising indium (In) can be subsequently deposited. Each layer can be at any thickness, for example, in the range from 100 nm to 900 nm. In some embodiments, a certain amount of selenium can be deposited in the course of step 212. For example, a thin layer of selenium at any thickness (e.g., 100-200 nm) can be formed as a middle layer when depositing Group I and Group III elements.

In some embodiments, during the sputtering process, indium can be doped with alkaline elements such as sodium (Na) or potassium (K). Doping an indium sputtering target with sodium may avoid or minimize an alkali-silicate layer in the solar cell.

Figure 4B:
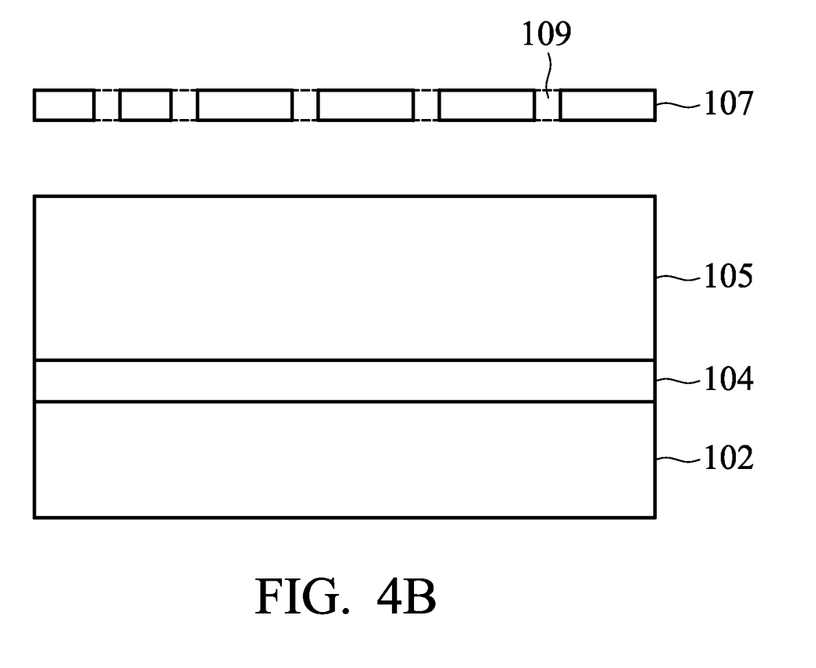
Figure 4C:
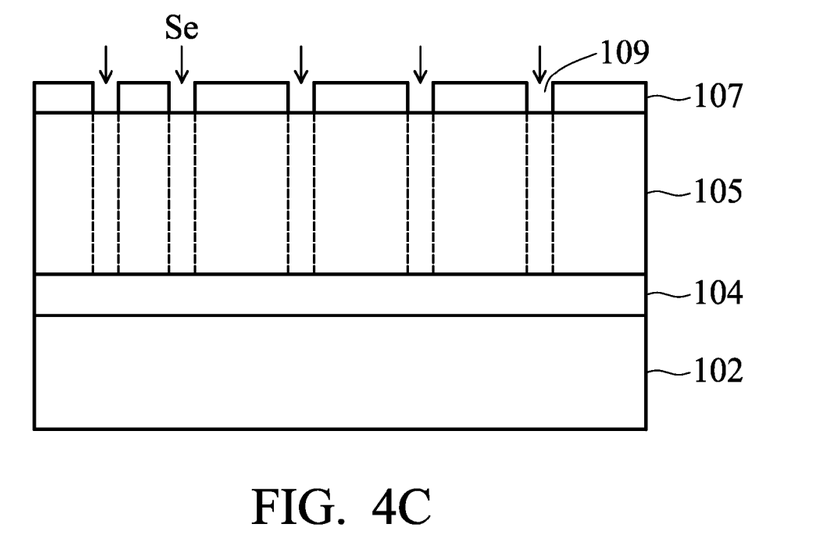

At step 213 of FIG. 2B, a mask 107 is placed above metal precursor layer 105, as shown in FIGS. 4B and 4C.

In some embodiments, mask 107 has patterning structures defining a plurality of holes 109 therethrough. Mask 107 can be made of any suitable material, which can be resistant to high temperature and chemicals. Each hole 109 on mask 107 is in any shape or size, for example, a circle, ellipse, oval, a polygon (e.g., triangle, quadrilateral, rectangle, square, hexagon, octagon), or any combination thereof. FIGS. 5A-5C illustrate exemplary masks 107-1, 107-2 and 107-3 in accordance with some embodiments. As shown in FIGS. 5A-5C, exemplary holes 109 can be in a shape of a circle 109-1, a square 109-2 or 109-3, or any other shape or combination, which can be oriented in different directions, and aligned in different arrays.

Each hole 109 can be of a suitable size or area. For example, in some embodiments, each of the plurality of holes 109 can have an area in the range of from 1 square micron to 1,000 square microns. Two adjacent holes 109 can have a distance from each other in the range from 1 micron to 1,000 microns in some embodiments.

At step 214 of FIG. 2B, as shown in FIG. 4C, a selenium-containing precursor is deposited onto metal precursor layer 105 at a temperature ($T_1$ in FIG. 3), for example, in the range of from 200° C. to 800° C. In some embodiments, the temperature is in the range of from 350° C. to 450° C. The time length ($t_1$ in FIG. 3) for depositing a selenium-containing precursor can be in the range of from 0.1 to 300 minutes. In some embodiments, the selenium-containing precursor can comprise hydrogen selenium or elemental selenium vapor.

While step 214 is performed, as shown in FIG. 4C, mask 107 is kept over metal precursor layer 105. Selenization occurs selectively in the exposed areas through the holes 109 on mask 107. Metal precursor layer 105 becomes metal precursor layer 105-2 after selenization.

Figure 4D:
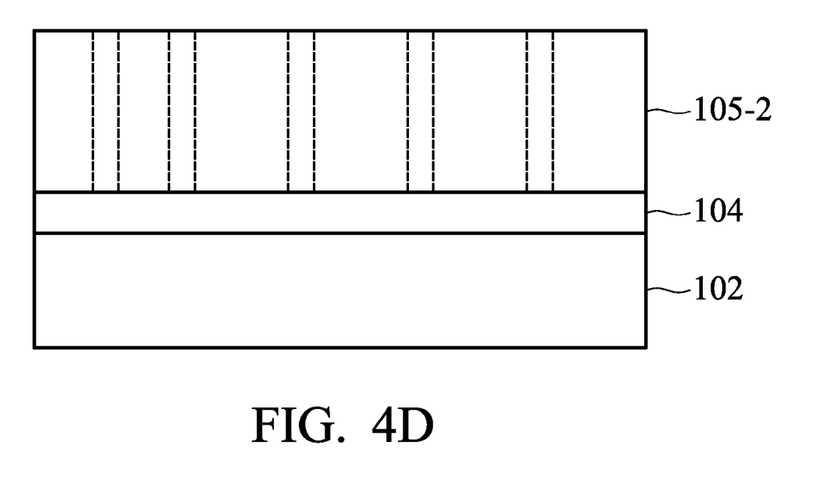

At step 215, mask 107 is removed. The resulting structure is illustrated in FIG. 4D.

At step 216, the photovoltaic device is annealed in an inert gas (e.g., $N_2$, Ar or any combination thereof) at a temperature ($T_2$ in FIG. 3), for example, in the range of from 200° C. to 800° C. In some embodiments, the temperature is in the range of from 500° C. to 600° C. The time length ($t_2$ in FIG. 3) for annealing can be in the range of from 0.1 to 300 minutes. The resulting structure is also illustrated in FIG. 4D.

Figure 4E:
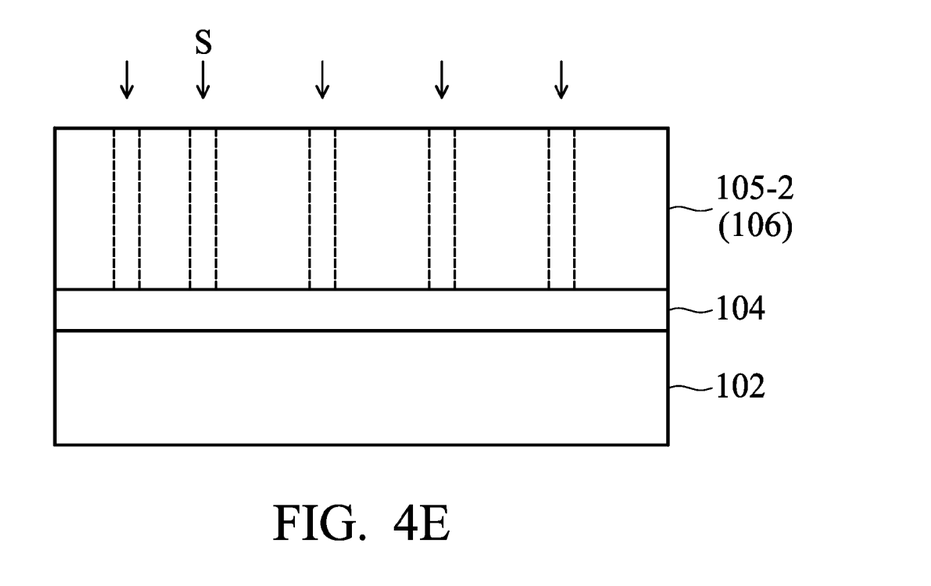

At step 218 of FIG. 2B, a sulfur-containing precursor is deposited onto the metal precursor layer 105-2 at a temperature ($T_3$ in FIG. 3), for example, in the range of from 200° C. to 600° C., after the step of annealing the photovoltaic device. In some embodiments, the temperature is in the range of from 450° C. to 550° C. The time length ($t_3$ in FIG. 3) for depositing a sulfur-containing precursor can be in the range of from 0.1 to 300 minutes. Examples of a sulfur-containing precursor include but are not limited to hydrogen sulfur or elemental sulfur vapor. Step 218 is illustrated in FIG. 4E. Sulfuration (step 218) of metal precursor layer 105-2 provides absorber layer 106.

In some embodiments, temperatures $T_1$ and $T_3$ are lower than temperature $T_2$ as shown in FIG. 3. Temperatures $T_1$ can be also lower than temperature $T_3$ as shown in FIG. 3.

Exemplary methods such as method 210 for forming absorber layer 106 provides a photovoltaic device 100 comprising absorber layer 106 having at least two regions. Photovoltaic device 100 comprising substrate 102, back contact layer 104 disposed above substrate 102, and absorber layer 106 disposed above back contact layer 104.

Absorber layer 106 comprises at least two regions at respectively different horizontally locations. Each respective region has a respectively different concentration profile of an ingredient at a respective depth of absorber layer 106. In some embodiments, absorber layer 106 comprises a I-III-$VI_2$ compound comprising a Group I element, a Group III element and a Group VI element. In some embodiments, the Group I element in the absorber layer 106 is Cu (or Ag). The Group III element in the absorber layer can comprise Al, Ga, In, Tl or a combination thereof. The Group VI element can be S, Se, or a combination thereof.

Figure 7:
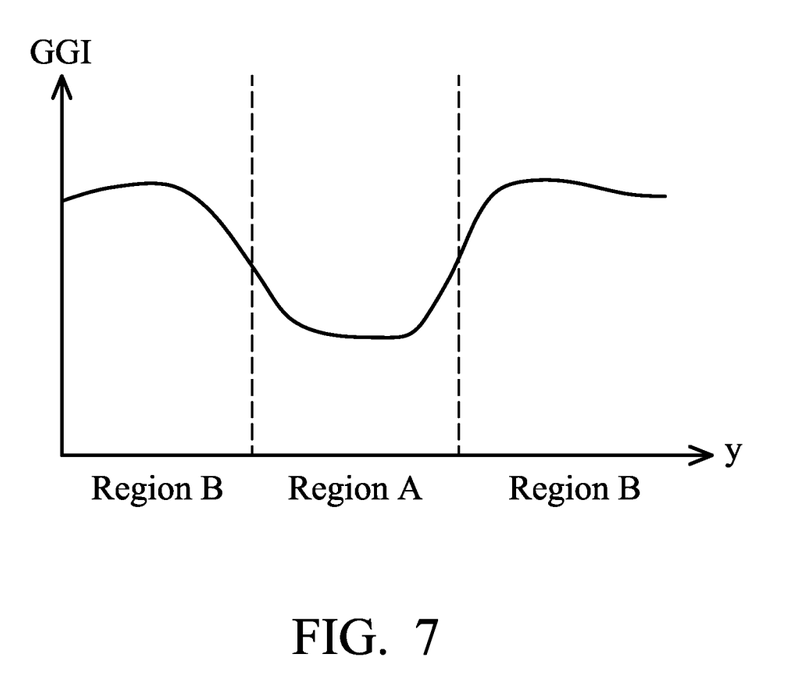
FIG. 7 illustrates an exemplary distribution of gallium represented by a GGI ratio in the region A and region B across an absorber layer in accordance with some embodiments.

In some embodiments, the concentration profile of the ingredient is a GGI ratio defined as an atomic ratio of gallium (Ga) to a total amount of gallium and indium (Ga+In) at a respective depth of the absorber layer. In some embodiments, as shown in FIG. 6A (plan view), absorber layer 106 comprises region A and region B. Region B is a continuous phase, and region A is a discrete phase aligned perpendicular to the absorber layer. A respective region A can have a shape such as a cylinder, a polygonal prism or a combination thereof. For example, a respective region A can have a shape selected from a cylinder, a cuboid, a rectangular prism, a triangular prism and any other regular polygonal prism. The size of region A is the same or substantially equal to the size of a respective hole 109 in mask 107 as described. As shown in FIG. 6B (cross-sectional view), in some embodiments, region B has a GGI ratio (i.e. GB(t)) at a first depth (i.e. thickness t) in absorber layer 106 higher than the GGI ratio of region A (i.e. GA(t)) at the first depth (t). The variable t is the distance between the top surface of absorber layer 106 (i.e. the interface between absorber layer 106 and buffer layer 108 to be formed) and a certain depth (t). In some embodiments, region A has a GGI ratio (GA(t)) in a range from 0 to 0.6, while region B has a GGI ratio in a range from 0.01 to 0.8, throughout a volume extending from a top surface (i.e. t=0) of absorber layer 106 to a bottom surface (i.e. t=T) of absorber layer 106. T in FIG. 6B is a total thickness of absorber layer 106. In either region A or region B, the GGI ratio, i.e. the atomic ratio of Ga/(Ga+In), increases from the top surface to the bottom surface of absorber layer 106. GA(t) is in the range of from 0 to 0.6. When $t_2 > t_1$, $GA(t_2) > GA(t_1)$, where t is in the range of from 0 to T. Similarly, GB(t) is in the range of from 0 to 0.8. When $t_2 > t_1$, $GB(t_2) > GB(t_1)$, where t is in the range of from 0 to T. In some embodiments, the difference in the GGI ratio between region B and region A is equal or higher than 0.01, i.e. $GB(t)-GA(t) \geq 1$, at the same thickness (t). FIG. 7 illustrates an exemplary distribution of gallium represented by a GGI ratio in the region A and region B across a horizontal plane of absorber layer 106. The atomic ratio of indium (In) to the total amount of Ga and In is one minus a corresponding GGI ratio. The content of Ga or In can be measured by a suitable instrumental analysis tool such as energy dispersive X-ray spectroscopy (EDS or EDX). Se and S can exist in region A and region B at any suitable ratio.

Photovoltaic device 100 can further comprise buffer layer 108 disposed over absorber layer 106. Photovoltaic device 100 can further comprise a front transparent layer 110 disposed above buffer layer 108 and an anti-reflection layer 116 disposed above front contact layer 110.

Referring back to FIG. 2A, at step 206, a buffer layer 108 (not shown) comprising a buffer material is formed over absorber layer 106. Examples of a buffer material include but are not limited to ZnS, CdS, CdSe, ZnO, ZnSe, $ZnIn_2Se_4$, $CuGaS_2$, $In_2S_3$, MgO and $Zn_{0.8}Mg_{0.2}O$ in some embodiments. Such a buffer material can be an n-type semiconductor and absorber layer 106 comprises p-type GIGS in some embodiments. The thickness of buffer layer 108 is on the order of nanometers, for example, in the range of from 5 nm to 100 nm in some embodiments.

Formation of buffer layer 108 can be achieved through a suitable process such as sputtering, chemical vapor deposition, and a hydrothermal reaction or chemical bath deposition (CBD) in a solution. For example, buffer layer 108 comprising ZnS can be formed in an aqueous solution comprising $ZnSO_4$, ammonia and thiourea at 80° C. A suitable solution comprises 0.16M of $ZnSO_4$, 7.5M of ammonia, and 0.6 M of thiourea in some embodiments.

At step 208, a front contact layer or front transparent layer 110 (not shown) is formed over buffer layer 108. As a part of "window layer," front transparent layer 110 can also comprise two layers, for example, including an intrinsic ZnO (i-ZnO) layer and a front contact layer comprising transparent conductive oxide (TCO) or any other transparent conductive coating in some embodiments. In some embodiments, undoped i-ZnO is used to prevent short circuiting in the photovoltaic device 100. In thin film solar cells, the film thickness of absorber layer 106 can range from several nanometers to tens of micrometers. If front contact layer 114 and back contact layer 104 are unintentionally connected because of defects in the thin films, an unwanted short circuit (shunt path) will be provided. Such phenomenon decreases performance of the photovoltaic devices, and can cause the devices to fail to operate within specifications. The loss of efficiency due to the power dissipation resulting from the shunt paths can be up to 100%. In some embodiments, undoped i-ZnO is thus provided in between the front- and the back contact layers to prevent short circuiting, for example, above buffer layer 108, between the buffer layer 108 and the front contact layer. Intrinsic ZnO having high electrical resistance can mitigate the shunt current and reduce formation of the shunt paths.

Front contact layer 110 is used in a photovoltaic (PV) device with dual functions: transmitting light to an absorber layer while also serving as a front contact to transport photo-generated electrical charges away to form output current. Transparent conductive oxides (TCOs) are used as front contacts in some embodiments. In some other embodiments, front contact layer is made of a transparent conductive coating comprising nanoparticles such as metal nanoparticles or nanotubes such as carbon nanotubes (CNT). Both high electrical conductivity and high optical transmittance of the transparent conductive layer are desirable to improve photovoltaic efficiency.

Examples of a suitable material for the front contact layer 110 include but are not limited to transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron doped ZnO (BZO), and any combination thereof. A suitable material can also be a composite material comprising at least one of the transparent conductive oxide (TCO) and another conductive material, which does not significantly decrease electrical conductivity or optical transparency of front contact layer. The thickness of front contact layer is in the order of nanometers or microns, for example in the range of from 0.3 nm to 2.5 μm in some embodiments.

An anti-reflection layer can be also is formed over front transparent layer 110 in some embodiments. Examples of a suitable material for anti-reflection layer 116 include but are not limited to $SiO_2$ and $MgF_2$.

The present disclosure also provides a method of fabricating a photovoltaic device 100. The method comprises forming back contact layer 104 above substrate 102, forming absorber layer 106 above substrate 102, and forming surface layer 107-2 on absorber layer 106 as described above.

Table 1 shows significant improvement in the performance of one exemplary resulting photovoltaic device 100 in accordance with some embodiments. As shown in FIG. 6A (plan view), absorber layer 106 comprises region A and region B. Region B is a continuous phase, and region A is a discrete phase aligned perpendicular to absorber layer 106. A respective region A can have a cylindrical shape. Region A has an area of 1 square micron in a cross-section. Two adjacent regions A are separated by a distance of 2 microns from each other. The total thickness of absorber layer 106 is 1.5 microns. As illustrated in FIG. 6B, in region A, the GGI ratio, GA(t), is in the range of from 0 to 0.6. In region B, GB(t) is in the range of from 0.4 to 0.8. Compared to a photovoltaic device having absorber layer having one dimensional ingredient distribution (the control), this resulting photovoltaic device 100 has significant improvement in different performance parameters as shown in Table 1. Each performance parameter is normalized against the corresponding performance parameter of the control (i.e. 1x). For example, open-circuit voltage (Voc) increased by 4% and short circuit current (Jsc) decreased by 4%, and the fill factor (FF) and efficiency both increase by 2.5%, in accordance with some embodiments in the present disclosure. The recombination current J0 decreases by 56%.

TABLE 1

| Absorber | Efficiency | Voc | FF | Jsc | J0 |
| --- | --- | --- | --- | --- | --- |
| One dimensional | 1x | 1x | 1x | 1x | 1x |
| Three Dimensional (with region A and B) | +2.5% | +4% | +2.5% | −4% | −56% |

The present disclosure provides a method of fabricating a photovoltaic device, and the resulting photovoltaic device.

The photovoltaic device comprises a substrate, a back contact layer disposed above the substrate, and an absorber layer disposed above the back contact layer. The absorber layer comprises at least two regions at respectively different horizontally locations. Each respective region has a respectively different concentration profile of an ingredient at a respective depth of the absorber layer. In some embodiments, the absorber layer comprises a I-III-VI$_2$ compound comprising a Group I element, a Group III element and a Group VI element. The Group I element in the absorber layer is Cu in some embodiments. The Group III element in the absorber layer can be selected from a group consisting of Al, Ga, In and Tl. The Group VI element can be selected from a group consisting of S and Se.

In some embodiments, the concentration profile of the ingredient is a GGI ratio defined as an atomic ratio of gallium (Ga) to a total amount of gallium and indium (Ga+In) at a respective depth of the absorber layer. In some embodiments, the absorber layer comprises region A and region B. Region B is a continuous phase, and region A is a discrete phase aligned perpendicular to the absorber layer. A respective region A can have a shape selected from the group consisting of a cylinder and a polygonal prism. In some embodiments, region B has a GGI ratio at a first depth in the absorber layer higher than the GGI ratio of region A at the first depth. In some embodiments, region A has a GGI ratio in a range from 0 to 0.6. Region B has a GGI ratio in a range from 0.01 to 0.8, throughout a volume extending from a top surface of the absorber layer to a bottom surface of the absorber layer.

In some embodiments, the photovoltaic device further comprises a buffer layer disposed over the absorber layer, and a front transparent layer disposed over the buffer layer.

In another aspect, the present disclosure provides a method of forming an absorber layer of a photovoltaic device. The method comprises the following steps: forming a metal precursor layer above a substrate, placing a mask above the metal precursor layer, and depositing a selenium-containing precursor onto the metal precursor layer. The selenium-containing precursor can be deposited onto the metal precursor layer at a temperature, for example, in the range of from 200° C. to 800° C.

In some embodiments, the metal precursor comprises a material selected from the group consisting of a Group I element and a Group III element. The Group I element in the absorber layer is Cu in some embodiments. The Group III element in the absorber layer is selected from a group consisting of Al, Ga, In and Tl.

In some embodiments, the mask has patterning structures defining a plurality of holes therethrough. Each of the plurality of holes on the mask is in a shape selected from the group consisting of a circle and a polygon. Each of the plurality of holes on the mask can have an area in the range of from 1 square micron to 1,000 square microns. Two adjacent holes of the plurality of holes have a distance from each other in the range from 1 micron to 1,000 microns in some embodiments.

In some embodiments, the method further comprises the following steps: removing the mask, annealing the photovoltaic device in an inert gas at a temperature, for example, in the range of from 200° C. to 800° C., and depositing a sulfur-containing precursor onto the metal precursor layer at a temperature, for example, in the range of from 200° C. to 600° C. In some embodiments, the selenium-containing precursor is deposited onto the metal precursor layer at a temperature in the range of from 350° C. to 450° C. The photovoltaic device is annealed in an inert gas at a temperature in the range of from 500° C. to 600° C. The sulfur-containing precursor is deposited onto the metal precursor layer at a temperature in the range of from 450° C. to 550° C.

In another aspect, the present disclosure provides a method of fabricating a photovoltaic device. Such a method comprises forming a back contact layer above a substrate, and forming an absorber layer above the back contact layer. The step of forming the absorber layer comprises the following steps: forming a metal precursor layer above a substrate, placing a mask above the metal precursor layer, and depositing a selenium-containing precursor onto the metal precursor layer. The mask has patterning structures defining a plurality of holes therethrough. Each of the plurality of holes on the mask can be in a shape selected from a group consisting of a circle and a polygon. In some embodiments, the metal precursor comprises a material selected from the group consisting of a Group I element and a Group III element. For example, the Group I element in the absorber layer is Cu in some embodiments. The Group III element in the absorber layer is selected from a group consisting of Al, Ga, In and Tl. The selenium-containing precursor is deposited onto the metal precursor layer at a temperature, for example, in the range of from 200° C. to 800° C.

In some embodiments, the step of forming the absorber layer further comprises the following steps: removing the mask, annealing the photovoltaic device in an inert gas at a temperature, for example, in the range of from 200° C. to 800° C., and depositing a sulfur-containing precursor onto the metal precursor layer at a temperature, for example, in the range of from 200° C. to 600° C.

The method of forming the photovoltaic device can further comprise forming a buffer layer over the absorber layer, and forming a front contact layer over the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photovoltaic device comprising:
    a substrate;
    a back contact layer disposed above the substrate; and
    an absorber layer disposed above the back contact layer,
        wherein the absorber layer comprises at least two regions at respectively different horizontal locations, the at least two regions are in one same layer,
        wherein each respective region has a respectively different concentration profile of an ingredient at a respective vertical depth of the absorber layer,
        wherein each region comprises a top surface and a bottom surface, and comprises gallium (Ga) from the top surface to the bottom surface, and
        wherein each respective bottom surface contacts the back contact layer.

2. The photovoltaic device of claim 1, wherein
    the absorber layer comprising a I-III-VI$_2$ compound comprising a Group I element, a Group III element and a Group VI element.

3. The photovoltaic device of claim 2, wherein
    the Group I element in the absorber layer is Cu;
    the Group III element in the absorber layer is selected from a group consisting of Al, Ga, In and Tl; and
    the Group VI element in the absorber layer is selected from a group consisting of S and Se.

4. The photovoltaic device of claim 1, wherein the concentration profile of the ingredient is a ratio defined as an atomic ratio of gallium (Ga) to a total amount of gallium and indium (Ga+In), (GGI), at the respective vertical depth of the absorber layer.

5. The photovoltaic device of claim 4, wherein the at least two regions in the absorber layer comprises a region A and a region B, region B is a continuous phase, and region A is a discrete phase distributed within region B and aligned perpendicular to the absorber layer.

6. The photovoltaic device of claim 5, wherein
    a respective region A has a shape of a cylinder or a polygonal prism.

7. The photovoltaic device of claim 5, wherein
    region B has a GGI ratio at a first depth vertically from a top surface of the absorber layer higher than the GGI ratio of region A at the first depth vertically from the top surface of the absorber layer.

8. The photovoltaic device of claim 5, wherein
    region A has a GGI ratio in a range from 0 to 0.6, and region B has a GGI ratio in a range from 0.01 to 0.8, throughout a volume extending from a top surface of the absorber layer to a bottom surface of the absorber layer.

9. The photovoltaic device of claim 1, further comprising:
    a buffer layer disposed over the absorber layer; and
    a front transparent layer disposed over the buffer layer.

10. A method of forming the absorber layer of the photovoltaic device of claim 1, comprising:
    forming a metal precursor layer above the substrate;
    placing a mask above the metal precursor layer, the mask having patterning structures defining a plurality of holes therethrough; and
    depositing a selenium-containing precursor onto the metal precursor layer.

11. The method of claim 10, wherein
    the metal precursor layer comprises a material selected from the group consisting of a Group I element and a Group III element;
    the Group I element is Cu, and
    the Group III element is selected from a group consisting of Al, Ga,
    In and Tl.

12. The method of claim 10, wherein
    each of the plurality of holes on the mask is in a shape selected from the group consisting of a circle and a polygon.

13. The method of claim 10, wherein
    each of the plurality of holes on the mask has an area in the range of from 1 square micron to 1,000 square microns; and
    two adjacent holes of the plurality of holes have a distance from each other in the range of from 1 micron to 1,000 microns.

14. The method of claim 10, further comprising:
    removing the mask;
    annealing the photovoltaic device in an inert gas at a temperature in the range of from 200° C. to 800° C.; and
    depositing a sulfur-containing precursor onto the metal precursor layer at a temperature in the range of from 200° C. to 600° C.

15. The method of claim 14, wherein
    the selenium-containing precursor is deposited onto the metal precursor layer at a temperature in the range of from 350° C. to 450° C.;
    the photovoltaic device is annealed in an inert gas at a temperature in the range of from 500° C. to 600° C.; and
    the sulfur-containing precursor is deposited onto the metal precursor layer at a temperature in the range of from 450° C. to 550° C.

16. A method of fabricating the photovoltaic device of claim 1, comprising
    forming the back contact layer above the substrate;
    forming the absorber layer above the back contact layer, wherein the step of forming the absorber layer comprises:
        forming a metal precursor layer above the substrate;
        placing a mask above the metal precursor layer, the mask having patterning structures defining a plurality of holes therethrough; and
        depositing a selenium-containing precursor onto the metal precursor layer.

17. The method of claim 16, wherein
    each of the plurality of holes on the mask is in a shape selected from a group consisting of a circle and a polygon.

18. The method of claim 16, wherein
    the metal precursor layer comprises a material selected from the group consisting of a Group I element and a Group III element;
    the Group I element is Cu, and the Group III element is selected from a group consisting of Al, Ga,
    In and Tl.

19. The method of claim 16, wherein the step of forming the absorber layer further comprises:
  removing the mask;
  annealing the photovoltaic device in an inert gas at a temperature in the range of from 200° C. to 800° C.; and
  depositing a sulfur-containing precursor onto the metal precursor layer at a temperature in the range of from 200° C. to 600° C.

20. The photovoltaic device of claim 1, wherein the substrate is planar.

* * * * *

UNITED STATES PATENT AND TRADEMARK OFFICE
CERTIFICATE OF CORRECTION

PATENT NO. : 9,653,628 B2  
APPLICATION NO. : 14/202049  
DATED : May 16, 2017  
INVENTOR(S) : Chien-Yao Huang Page 1 of 1

It is certified that error appears in the above-identified patent and that said Letters Patent is hereby corrected as shown below:

In the Claims

Claim 11, Column 12, Line 16, remove "Tl" and insert -- T1 --

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*